US006534362B2

(12) United States Patent
Reisinger (10) Patent No.: US 6,534,362 B2
(45) Date of Patent: Mar. 18, 2003

(54) METHOD FOR FABRICATING A MEMORY CELL CONFIGURATION

(75) Inventor: Hans Reisinger, Grünwald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/005,978

(22) Filed: Dec. 3, 2001

(65) Prior Publication Data
US 2002/0055247 A1 May 9, 2002

Related U.S. Application Data (62) Division of application No. 09/668,485, filed on Sep. 25, 2000, now Pat. No. 6,365,944, which is a continuation of application No. PCT/DE99/00762, filed on Mar. 17, 1999.

(30) Foreign Application Priority Data

Mar. 24, 1998 (DE) .......................................... 198 12 948

(51) Int. Cl.[7] .............................................. H01L 21/336
(52) U.S. Cl. ........................ 438/257; 438/262; 438/282
(58) Field of Search ................................ 438/257, 259, 438/262, 268, 270, 271, 272, 294, 302, 282

(56) References Cited

U.S. PATENT DOCUMENTS

| 4,651,184 A | * | 3/1987 | Malhi .......................... 257/302 |
| 5,278,438 A | * | 1/1994 | Kim et al. ................... 257/316 |
| 5,306,941 A | | 4/1994 | Yoshida |
| 5,990,529 A | * | 11/1999 | Shin ............................ 257/408 |
| 6,207,493 B1 | * | 3/2001 | Furukawa et al. ........... 438/246 |
| 6,232,632 B1 | * | 5/2001 | Liu .............................. 257/315 |

FOREIGN PATENT DOCUMENTS

| DE | 195 10 042 A1 | 9/1996 |
| EP | 0 547 711 A2 | 6/1993 |
| JP | 04-109670 | 4/1992 |
| WO | WO 96/33513 | 10/1996 |

* cited by examiner

Primary Examiner—Tuan H. Nguyen
(74) Attorney, Agent, or Firm—Laurence A. Greenberg; Werner H. Stemer; Gregory L. Mayback (57) ABSTRACT

A method for fabricating a memory cell configuration, which includes the steps of etching isolation trenches into a semiconductor substrate and thereby forming webs between the isolation trenches and producing bit lines after channel regions have been produced. It furthermore includes performing an etching step which results in the isolation trenches penetrating more deeply into the semiconductor substrate.

3 Claims, 6 Drawing Sheets

METHOD FOR FABRICATING A MEMORY CELL CONFIGURATION

Cross-Reference to Related Application

This is a division of U.S. application Ser. No. 09/668,485, filed Sep. 25, 2000, now U.S. Pat. No. 6,365,944, which was a continuation of copending International application PCT/DE99/00762, filed Mar. 17, 1999, which designated the United States.

BACKGROUND OF THE INVENTION

1. Field of the Invention

The invention relates to a method for fabricating a memory cell configuration in which a plurality of memory cells are present in the region of a main area of a semiconductor substrate, in which the memory cells each contain at least one MOS transistor having a source, gate and drain, in which the memory cells are configured in memory cell rows which run essentially parallel, in which adjacent memory cell rows are insulated by an isolation trench, in which adjacent memory cell rows each contain at least one bit line, and where the bit lines of two adjacent memory cell rows face one another.

Memory cells are used in wide areas of technology. The memory cells may involve both read-only memories, which are referred to as ROMS, and programmable memories, which are referred to as PROMs (programmable ROMs).

Memory cell configurations on semiconductor substrates are distinguished by the fact that they allow random access to the information stored in them. They contain a multiplicity of transistors. During the reading operation, the logic states 1 or 0 are assigned to the presence or absence of a current flow through the transistor. The storage of the information is usually effected by using MOS transistors whose channel regions have a doping which corresponds to the desired blocking property.

A memory cell configuration of the generic type is shown in Yoshida (5,306,941). In this memory cell configuration, bit lines are configured in the edge region of memory cell webs, and the bit lines of adjacent memory cell webs face one another. In this case, the bit lines are isolated from one another in each case by an isolation trench filled with an insulating material. This document furthermore discloses a method for fabricating a memory cell configuration, in which memory cell webs are formed by etching isolation trenches into a semiconductor substrate. The etching of the isolation trenches is followed by diffusion of a dopant, bit lines being formed by the diffusion. This memory cell configuration of the generic type is suitable for feature sizes of at least 0.5 µm and for a ROM read-only memory. Electrical programming is not possible in this case.

A further memory cell configuration is disclosed in DE 195 10 042 A1. This memory cell configuration contains MOS transistors configured in rows. The MOS transistors are connected in series in each row. In order to increase the storage density, adjacent rows are in each case configured alternately at the bottom of strip-type longitudinal trenches and between adjacent strip-type longitudinal trenches at the surface of the substrate. Interconnected source/drain regions are designed as a contiguously doped region. Row-by-row driving enables this memory cell configuration to be read.

This memory cell configuration is distinguished by the fact that the area requirement that is necessary for the memory cells has been reduced from 4 $F^2$ to 2 $F^2$ where F is the minimum feature size of the photolithographic process used for the fabrication. What is disadvantageous, however, is that a further increase in the number of memory cells per unit area is not possible in this case.

SUMMARY OF THE INVENTION

It is accordingly an object of the invention to provide a method for fabricating a memory cell configuration which overcomes the herein afore-mentioned disadvantages of the heretofore-known methods and devices of this general type in such a way the greatest possible number of memory cells is configured in the smallest possible space. Preferably, the memory cell configuration shall also be electrically programmable.

In the case of a device of the generic type, this object is achieved by virtue of the fact that the isolation trench penetrates more deeply into the semiconductor substrate than to the bit lines, and in that at least one partial region of the source and/or of the drain is situated underneath the isolation trench.

The invention thus provides for the memory cell configuration to be configured in such a way that it contains memory cell webs between which there are isolation trenches which penetrate deeply into the semiconductor substrate and thus enable effective insulation of mutually opposite bit lines.

An electrical connection between the sources and/or the drains of different memory cell webs is preferably effected by a partial region of the sources and/or of the drains extending from one memory cell web to a further memory cell well.

In this case, the sources and/or drains of different transistors are preferably located in a common well.

The memory cell configuration is made electrically programmable by the provision of a gate dielectric with traps for electrical charge carriers, for example a triple layer having a first $SiO_2$ layer, layer, an $Si_3N_4$ layer and a second $SiO_2$ layer, or the like.

With the foregoing and other objects in view there is provided, in accordance with the invention, a memory cell configuration, that includes a semiconductor substrate with a plurality of memory cells each including at least one MOS transistor having a source, a gate, and a drain. The plurality of memory cells are configured in substantially parallel memory cell rows. Each of the memory cell rows include at least one bit line configured such that a bit line is of one of the memory cell rows faces a bit line of an adjacent one of the memory cell rows. The semiconductor substrate includes isolation trenches insulating adjacent ones of the memory cell rows. The isolation trenches penetrate more deeply into the substrate than the at least one bit line. The at least one MOS transistor includes a region configured to be at least partially underneath the isolation trench, and the region is selected from the group consisting of the source and the drain.

In accordance with an added feature of the invention, the sources of adjacent ones of the MOS transistors are designed as a continuously doped region.

In accordance with an additional feature of the invention the drains of adjacent ones of the MOS transistors are designed as a continuously doped region.

In accordance with another feature of the invention, the isolation trenches penetrate from 0.1 µm to 0.5 µm more deeply into the semiconductor substrate than the at least one bit line.

In accordance with a further feature of the invention, the at least one bit line of each of the memory cell rows has a height of from 0.1 µm to 0.3 µm.

In accordance with a further added feature of the invention, there is provided a web with mutually opposite side walls configured between each two adjacent ones of the isolation trenches. Each web includes two of the memory cell rows. The at least one bit line of each of the memory cell rows adjoin one of the side walls of the web. Adjacent ones of the memory cells that are perpendicular to a course of the bit lines have a common region selected from the group consisting of a common source region and a common drain region.

With the foregoing and other objects in view there is also provided, in accordance with the invention, a method for fabricating a memory cell configuration, which includes steps of: etching isolation trenches into a semiconductor substrate and thereby forming webs between the isolation trenches; producing bit lines after channel regions have been produced; and subsequent to producing the bit lines, performing an etching step resulting in the isolation trenches penetrating more deeply into the semiconductor substrate.

Other features which are considered as characteristic for the invention are set forth in the appended claims.

Although the invention is illustrated and described herein as embodied in a method for fabricating a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
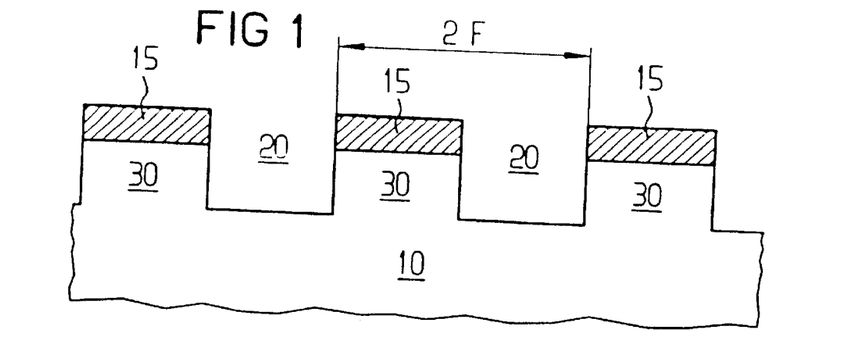
FIG. 1 shows a cross section through a semiconductor substrate after a first etching operation.

Referring to the figures of the drawing in detail and first, particularly, to FIG. 1 thereof, there is shown a mask 15 which is applied to a semiconductor substrate 10 that is made, for example, of n-doped monocrystalline silicon with a basic dopant concentration of, preferably, from $1\times10^{16}$ $cm^{-3}$ to $1\times10^{17}$ $cm^{-3}$, for example $2\times10^{16}$ $cm^{-3}$. The mask 15 may be composed for example of silicon oxide formed according to a TEOS ($Si(OC_2H_5)_4$) method. In a TEOS method, tetraethyl orthosilicate $Si(OC_2H_5)_4$ is converted into silicon oxide $SiO_2$ at a temperature of approximately 700 degrees Celsius and a pressure in the region of 40 Pa.

After the application of the mask 15, an etching process is carried out, for example a multistage process with a first etching step with a gas mixture comprising $CF_4$ and $O_2$ or $CHF_3$ and $O_2$ and a second etching step with an HBr-containing gas, with the result that isolation trenches 20 are formed in the semiconductor substrate 10.

There are webs 30 between the isolation trenches 20, the distance between the centers of adjacent webs 30 being 2F. In this case, F is the minimum feature size that can be fabricated, and is preferably in the range of from 0.1 μm to 0.5 μm. This processing state of the semiconductor substrate is illustrated in FIG. 1.

Figure 2:
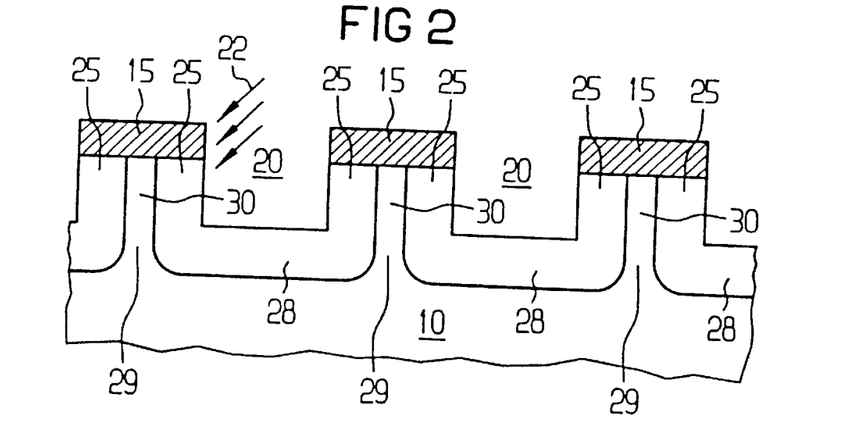
FIG. 2 shows the semiconductor substrate illustrated in FIG. 1 after the implantation of a first dopant.

A first dopant 22 is subsequently implanted, with the result that side regions 25 of the webs 30 and lower bottom regions 28 of the isolation trenches 20 are p-doped. The side regions 25 of the webs 30 and the bottom regions 28 of the isolation trenches 20 form channel regions in the finished memory cell configuration. In order to produce p-type doping, boron, for example, is implanted at an implantation energy preferably of the order of magnitude of from 10 to 20 keV. The implantation dose is equal to the product of a desired concentration and the thickness of a layer to be doped. For example, the implantation dose is $4\times10^{12}$ $cm^{-2}$, given a preferred layer thickness of about 0.2 μm and an advantageous concentration of $2\times10^{17}$ $cm^{-3}$. After the implantation and drive-in, the concentration of the dopant in the side regions 25 and in the lower bottom regions 28 is approximately $2\times10^{17}$ $cm^{-3}$. As a result of the dopant drive-in, a bottom region 28, with two side regions 25 connected to it, forms a region in which a continuous channel can form in the finished memory cell is configuration. This processing state of the semiconductor substrate is illustrated in FIG. 2.

Figure 3:
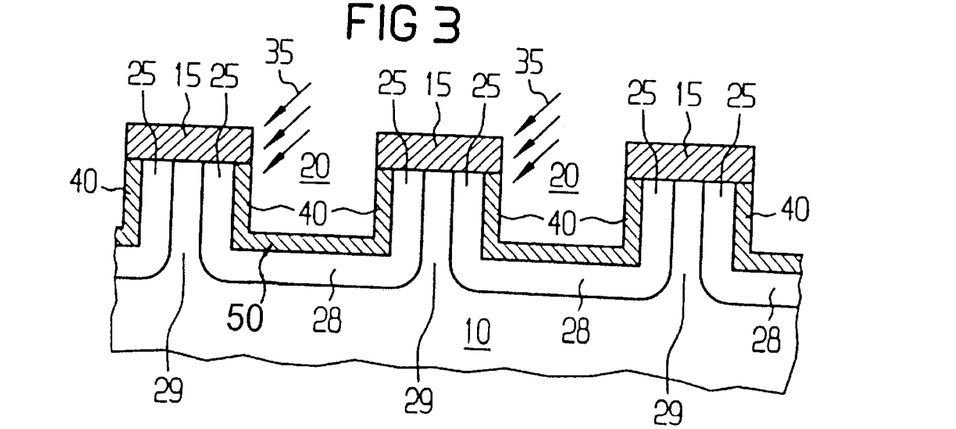
FIG. 3 shows the semiconductor substrate after the implantation of a second dopant.

A further dopant 35 is subsequently implanted, with the result that side walls 40 of the webs 30 and upper bottom regions 50 of the isolation trenches 20 are heavily doped by the opposite conductivity type to that of the side regions 25 and of the bottom region 28. In order to produce $n^+$-type doping, phosphorus or arsenic, for example, is implanted at an implantation energy preferably of the order of magnitude of from 40 to 80 keV, and with a dose in the region around $2\times10^{15}$ $cm^{-2}$.

After this implantation, the concentration of the dopant in the side walls 40 and in the upper bottom regions 50 is approximately $2\times10^{20}$ $cm^{-3}$. This processing state of the semiconductor substrate is illustrated in FIG. 3.

Figure 4:
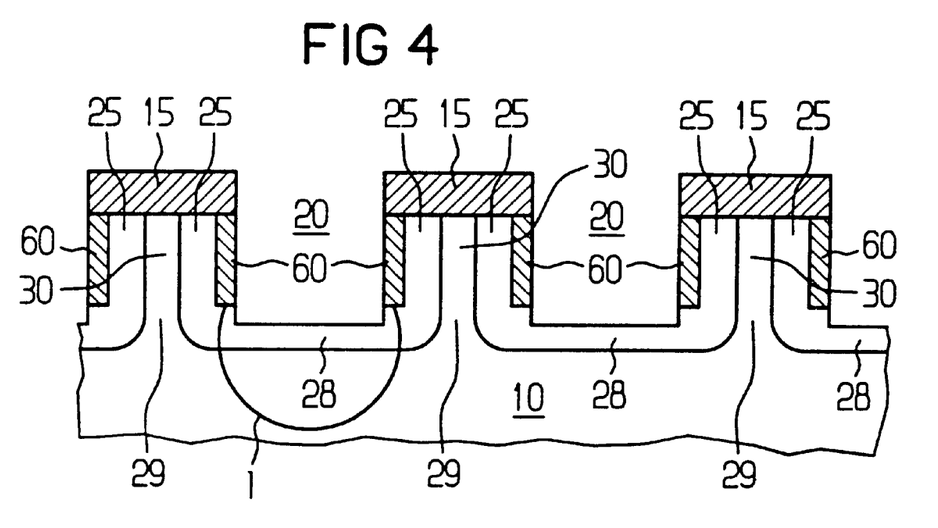
FIG. 4 shows the semiconductor substrate after a further etching operation.

In order to provide insulation between the individual webs 30, a further etching process is subsequently performed. As a result of this, the isolation trenches 20 are etched more deeply and the doped upper bottom regions 50 of the isolation trenches 20 are removed. As a result of this process, bit lines 60 that are spacially separate from one another are formed from the side walls 40 of the webs 30, mutual insulation between the bit lines being ensured by virtue of the fact that the isolation trenches 20 penetrate as far as possible into the substrate. Parts of the bit lines 60 form drains of MOS transistors in the finished memory cell configuration. The bit lines 60 have a height of approximately 200 nm. The depth of the isolation trenches 20 is greater than the height of the bit lines 60. An effective path length 1 for a possible current path through the semiconductor substrate 10 is thereby enlarged. This processing state of the semiconductor substrate is illustrated in FIG. 4.

A low-resistance connection between the sources 29 is effected for example via a common well (not shown). A connection may, for example, also be effected via the semiconductor substrate or an electrically conductive layer.

The width of the bit lines 60 is approximately 50 nm. Given a cross-sectional area of $(200 \times 10^{-9}$ m$) \times (50 \times 10^{-9}$ m$) = 1 \times 10^{-14}$ m$^2$, the bit lines thus have a resistance of the order of magnitude of a few 100 kΩ per mm length of the bit line, a typical value being 500 kΩ/mm. Cell arrays with an edge length of about 1 mm can be realized as a result of this.

Figure 5:
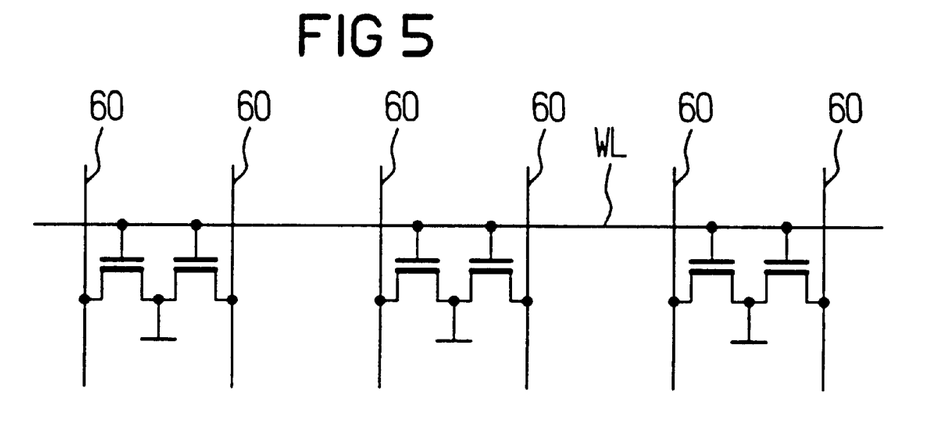
FIG. 5 shows a circuit diagram for an electrical connection of individual regions of the semiconductor substrate illustrated in FIG. 4.

A typical threshold voltage of a memory cell configuration of this type is approximately 0.6 V. A circuit diagram for an electrical connection of the bit lines 60 and of word lines WL is illustrated in FIG. 5.

Through a siliciding process (not shown), the resistance of the bit lines 60 can be considerably reduced, preferably by a factor of 10 or more. In the case of such a siliciding process, the bit lines 60 are converted into a suitable silicide, i.e. into a metal-silicon compound. In the present case, it is particularly expedient to produce silicides such as $MoSi_2$, $WSi_2$, $TaSi_2$, $TiSi_2$, PtSi, $Pd_2Si$ by siliconization. Siliconization is a process of selective silicide formation. It is preferably performed by the silicide-forming metal being sputtered on alone and then being brought to a silicide reaction with the bit lines as silicon support. The application of the silicide-forming metal is followed by heat treatment at temperatures in the range of from 600 to 1000° C., thereby resulting in the formation of the metal silicide.

The mask 15 is subsequently removed. After the removal of the mask 15, the isolation trenches 20 are filled with an insulating material, for example with $SiO_2$ formed using a TEOS method. This can be done by converting tetraethyl orthosilicate: $Si(OC_2H_5)_4$ into silicon oxide $SiO_2$ at a temperature of approximately 700° C. and a pressure in the region of 40 Pa.

The filling of the isolation trenches 20 with the insulating material is followed by a planarization operation, preferably a process of chemical mechanical planarization. A suitable dielectric layer is then applied to the webs 30 and the isolation trenches 20. The dielectric layer may preferably be formed by a multiple layer. It is particularly expedient if the dielectric layer is a triple layer, having a first dielectric layer 90 made of silicon oxide $SiO_2$ having a thickness of approximately 3 nm, a middle dielectric layer 100 made of silicon nitride having a thickness of approximately 7 to 8 nm, and an upper dielectric layer 110 made of silicon oxide having a thickness of about 4 nm.

The first dielectric layer 90 is formed to a desired layer thickness for example by heat treatment in an $O_2$-containing atmosphere. In this case, the silicon of the webs 30 is converted into silicon oxide $SiO_2$. This layer may subsequently be patterned by anisotropic etching using $CHF_3$, for example.

The second dielectric layer 100 is preferably applied according to a CVD (Chemical Vapor Deposition) method, in particular according to an LPCVD (Low Pressure CVD) method. A particularly suitable variant for forming the second dielectric layer 100 according to the LPCVD method may be performed by converting dichlorosilane ($SiH_2Cl_2$) into silicon nitride ($Si_3N_4$) with addition of ammonia ($NH_3$) at a temperature in the region of about 750° C. in a plasma at a pressure of between 10 Pa and 100 Pa, preferably 30 Pa.

The upper dielectric layer 110 is subsequently deposited by thermal oxidation, preferably in an $H_2O$-containing atmosphere at a temperature of around 900° C. and for a period of about 2 hours, or according to one of the known layer-producing methods, for example an HTO method. Deposition using an HTO method may preferably be done by converting dichlorosilane $SiH_2Cl_2$ into silicon oxide $SiO_2$ in an $N_2O$-containing atmosphere at a temperature of approximately 900° C. and a pressure in the region of 40 Pa.

A semiconductor layer 120, for example made of heavily doped polycrystalline silicon, is grown onto the upper dielectric layer 110. A preferred doping of the polycrystalline silicon is at least $10^{20}$ cm$^{-3}$, dopings above $10^{21}$ cm$^{-3}$ being particularly suitable.

By way of example, the semiconductor layer 120 is $n^+$-doped by diffusion or implantation of phosphorus or arsenic. Implantation may be effected for example with an energy of 80 keV and a dose of $1 \times 10^{16}$ cm$^{-2}$.

A resist mask is subsequently applied to the semiconductor layer 120. This is followed by an etching process, for example a multistage process with a first etching step with a gas mixture comprising $CF_4$ and $O_2$ or $CHF_3$ and $O_2$ and a second etching step with an HBr-containing gas. Isolation trenches 130 are thereby etched into the semiconductor layer 120. Webs 140 are produced between the isolation trenches 130 as a result of the remaining material of the semiconductor layer 120, the webs serving as word lines in the completed memory cell configuration.

An insulation layer 150 is subsequently deposited onto the webs 140 and the isolation trenches 130 according to a suitable method that is as far as possible conformal. It is particularly expedient for the insulation layer 150 to be formed according to a TEOS method. This can be done by converting tetraethyl orthosilicate $Si(OC_2H_5)_4$ into silicon oxide $SiO_2$ at a temperature of approximately 700° C. and a pressure in the region of 40 Pa.

Figure 6:
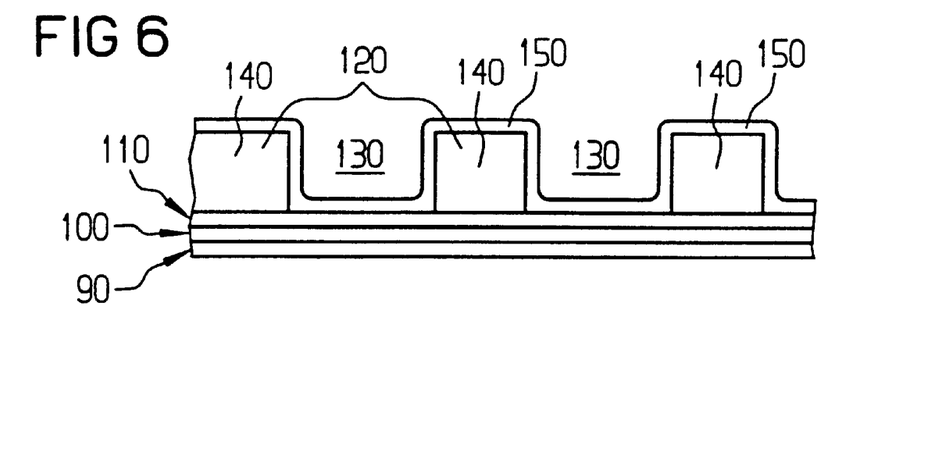
FIG. 6 shows a detail from a section perpendicular to the section shown in FIGS. 1 to 4, through the upper region of the semiconductor substrate after the deposition of a dielectric layer, the deposition and patterning of a semiconductor layer and the deposition of a further insulating material.

That detail of the semiconductor substrate which contains the dielectric layers 90, 100 and 110 and also the webs 140 is illustrated in FIG. 6. In this case, FIG. 6 shows a section which runs perpendicularly to the section shown in FIGS. 1 to 4 through one of the webs 30.

Figure 7:
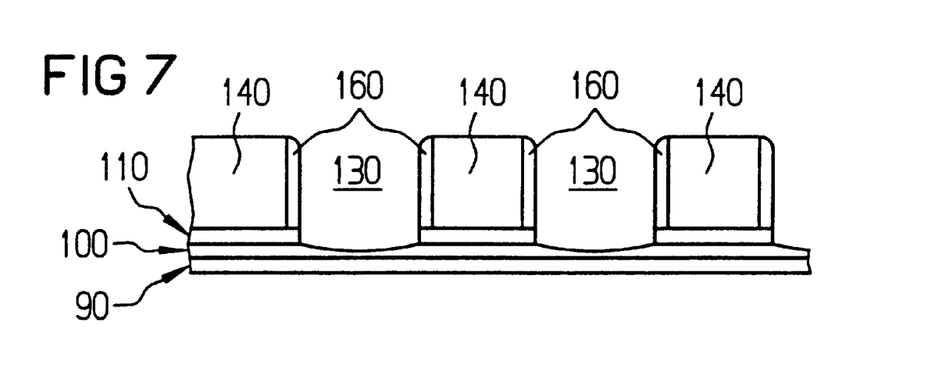
FIG. 7 shows the detail from the upper region of the semiconductor substrate after the performance of anisotropic etching for the purpose of forming spacers.

The insulation layer 150 is subsequently etched anisotropically, the etching removal of this etching operation corresponding to the thickness of the insulation layer 150 on planar regions. Spacers 160 therefore remain on the side walls of the webs 140, the spacers also being referred to as TEOS spacers. This state of the semiconductor substrate is illustrated in FIG. 7.

Figure 8:
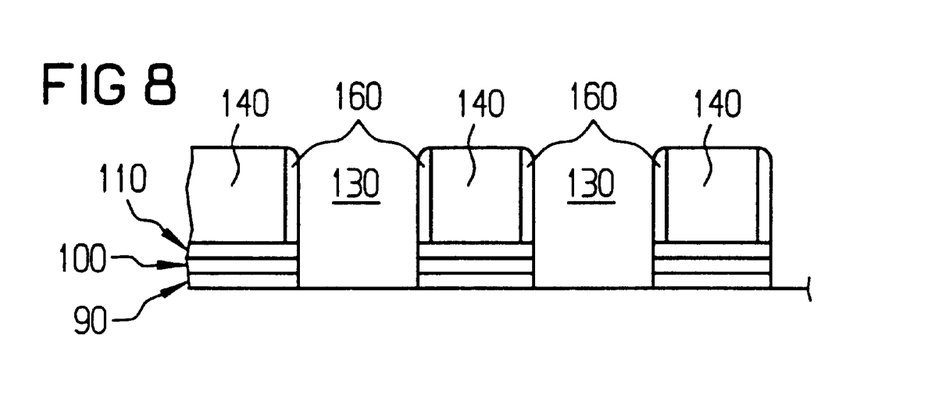
FIG. 8 shows the detail from the upper region of the semiconductor substrate after a further etching operation.

An etching process is subsequently performed, the nitride-containing dielectric layer 100 being removed by the use of a suitable agent, for example phosphoric acid with a concentration in the region of 80% and a temperature of around 150° C. The multistage etching process stops at the oxide-containing lower dielectric layer 90. The thin dielectric layer 90 is removed in the region of the isolation trenches 130 by means of a further etching operation, for example using a hydrofluoric acid-containing solution (HFdip). This state of the semiconductor substrate is illustrated in FIG. 8. A new triple layer is subsequently grown. To that end, a lower dielectric layer 180, a middle dielectric layer 190 and an upper dielectric layer 200 are formed. The lower dielectric layer 180 is preferably composed of silicon oxide $SiO_2$, which is formed to a desired layer thickness using a heat-treatment method, for example. In this case, in the surface region of the webs 140 and of the semiconductor material 120, silicon is converted into silicon oxide $SiO_2$ in an oxygen-containing atmosphere at a temperature of approximately 800 to 900° C. The middle dielectric layer 190 is preferably formed by a nitride layer which has been produced by means of an LPCVD method at approximately 700° C. The topmost dielectric layer 200 is preferably composed of the same material as the lower dielectric layer 180, that is to say once again preferably of $SiO_2$. In the final state, the thickness of the lower dielectric layer 180 is 3 nm, for example, the thickness of the middle dielectric layer 190 is approximately 7 to 8 nm and the thickness of the upper dielectric layer 200 is 4 nm. Such a sequence of the thicknesses of the layers is particularly expedient for storing captured charges as long as possible.

Figure 9:
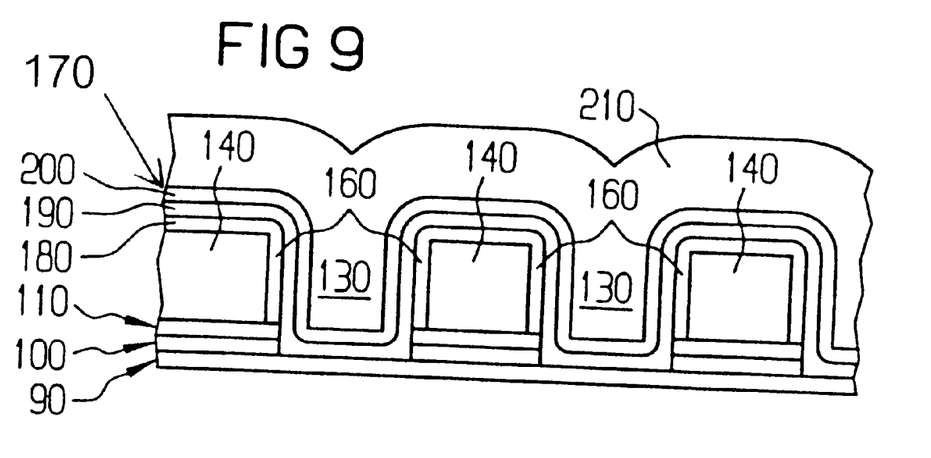
FIG. 9 shows the detail from the upper region of the semiconductor substrate after the growth of a dielectric layer.

This state of the semiconductor substrate is illustrated in FIG. 9.

An electrode layer 210 is subsequently formed over the whole area. The electrode layer 210 is composed for example of a doped semiconductor material, preferably n-doped polycrystalline silicon, metal silicide and/or a metal.

However, the semiconductor material of the electrode layer 210 may also be p-doped.

The electrode layer 210 is formed to a thickness which suffices to fill the isolation trenches 130 between the webs 140 forming the word line. The electrode layer 210 is therefore deposited to a thickness of approximately 0.2 μm to 0.6 μm, preferably 0.4 μm.

The electrode layer 210 is subsequently patterned. The electrode layer 210 is patterned in a method which has a number of steps. Firstly, the electrode layer 210 is removed by a planarization process, for example a CMP (Chemical Mechanical Planarization) step. In this case, the middle dielectric layer 190 acts as a stop layer.

Figure 10:
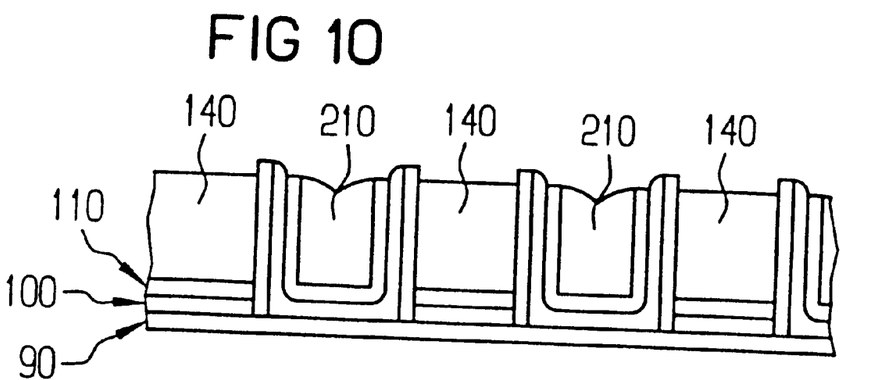
FIG. 10 shows the detail from the upper region of the semiconductor substrate after the application and partial etching away of an electrode layer.

The dielectric layer 170 is subsequently removed above the webs by the removal of its partial layers 180, 190 and 200. This is followed by further etching back or a process of chemical mechanical planarization (CMP) (FIG. 10).

In the memory cell configuration, memory cells are realized by MOS transistors each formed from part of one of the bit lines 60, which acts as drain, the adjoining side region 25, which acts as a channel region, one of the sources 29 and the dielectric layer 90, 100, 110, which acts as a gate dielectric, and one of the webs 140, which acts as a gate electrode, or the triple layer 180, 190, 200, which acts as a gate dielectric, and part of the patterned electrode layer 210, which acts as a gate electrode.

Since the webs 140 and the patterned electrode layer 210 are fabricated in a self-aligned manner with respect to one another, the memory cell configuration can be fabricated with a distance between the centers of adjacent gate electrodes along one of the webs 30 of a minimum feature size F that can be fabricated. The distance between the centers of adjacent webs 30 is a minimum of 2F given the use of a mask 15 which is fabricated with the aid of photolithographic process steps. Since the webs 30 each have two adjacent memory cells perpendicular to the course of the bit lines 60, the space requirement per memory cell is $F^2$.

If the mask 15 is formed with the aid of a spacer technique, then a distance between the centers of adjacent webs 30 of F is achieved. This results in a space requirement per memory cell of $0.5 \times F^2$.

Figure 11:
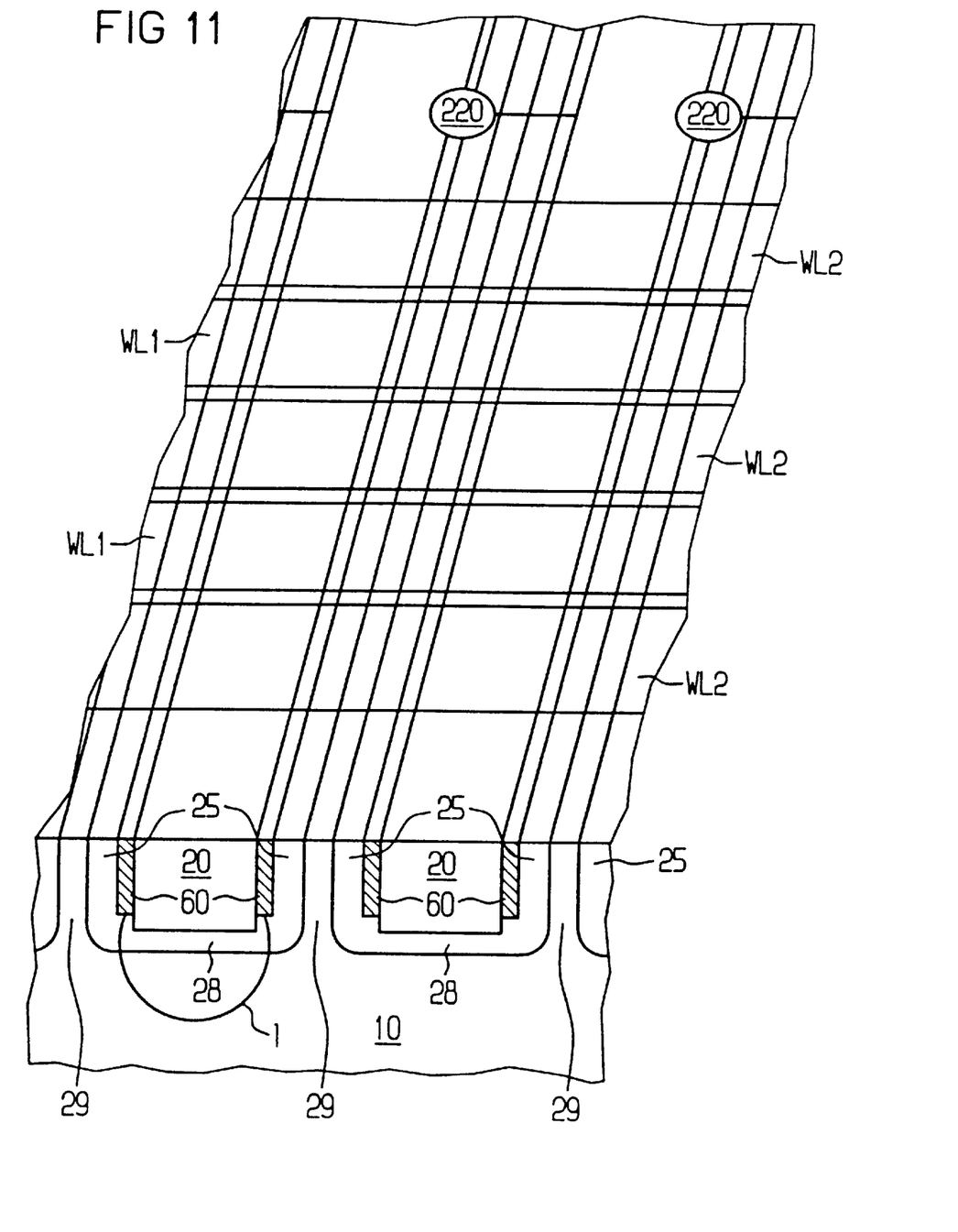
FIG. 11 shows a plan view of the finished memory cell configuration.

A plan view of the finished memory cell configuration is illustrated in FIG. 11. This illustration shows the configuration of the bit lines 60 and of first word lines WL1 and second word lines WL2. The first word lines WL1 and the second word lines WL2 are formed by the webs 140 and by the patterned electrode layer 210 (see FIG. 10), respectively.

It can be seen here that, of the two bit lines 60 that are present on a web 30, one bit line 60 in each case is connected to a contact 220 in the upper region of the cell array. The respective other bit line 60 of the web 30 is connected to the lower edge of the cell array in a manner that is not illustrated.

Figure 12:
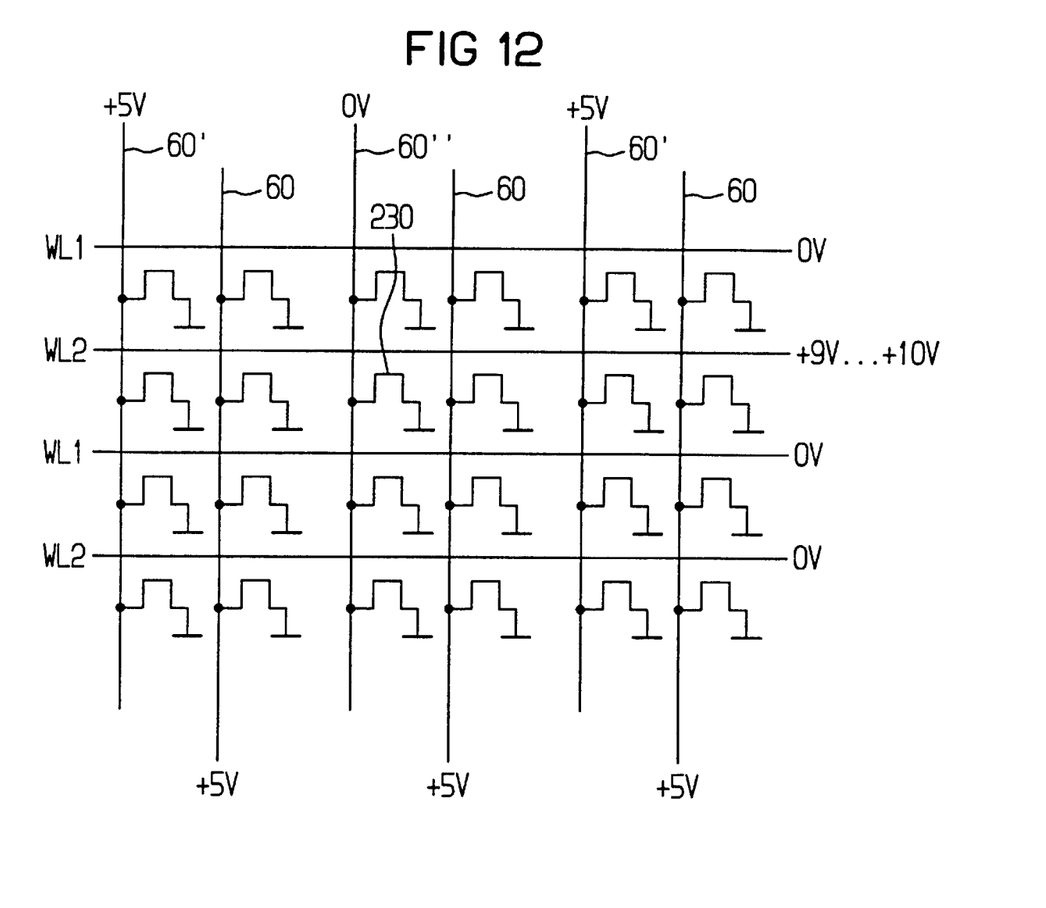
FIG. 12 shows the electrical circuit diagram of a detail from the cell array.

FIG. 12 illustrates the electrical circuit diagram of a detail from the cell array.

Interconnection between the bit lines 60, 60', 60" and word lines WL1 and WL2 can be seen here.

In order to clarify the method of operation of the electrical circuit, those voltages which are necessary to write to a memory cell 230 are illustrated by way of example.

The memory cell 230 is written to by the tunneling of electrical charge. A gate voltage of, preferably, from 9 V to 10 V is applied to the memory cell 230 via the associated word line WL2. The common sources of all the memory cells are at a common, elevated potential of 5 V, for example. A drain voltage of 0 V is applied to the memory cell 230 via the bit line 60". Either a gate voltage 0 or a positive drain voltage of 5 V, for example, is applied to the other cells. This prevents cells that have already been written to from being erased.

A memory cell is read preferably in such a way that the common sources of the memory cells are at 0 V, that the bit line associated with the cell is at a positive potential, and that the word line associated with the cell is at a potential of 3 V, for example.

All of the memory cells are erased simultaneously preferably by the common sources of the cells being at 0 V, by all the bit lines 60, 60', 60" being at the potential 0 V, and by a negative gate voltage of −10 V, for example, being applied via the word lines WL1 and WL2.

The invention is not restricted to the exemplary embodiments described. In particular, the n-type and p-type dopings can be interchanged.

I claim:

1. A method for fabricating a memory cell configuration, which comprises:
   etching isolation trenches with side regions into a semiconductor substrate and thereby forming webs between the isolation trenches;
   producing channel regions on the side regions of the isolation trenches;
   producing bit lines on the side regions of the isolation trenches after the channel regions have been produced; and
   subsequent to producing the bit lines, performing an etching step resulting in the isolation trenches penetrating more deeply into the semiconductor substrate.

2. The method according to claim 1, which comprises performing ion implantation to produce the bit lines.

3. The method according to claim 1, which comprises converting the bit lines into a metal-silicon compound.

* * * * *